(12) United States Patent
Hara et al.

(10) Patent No.: US 10,115,619 B2
(45) Date of Patent: Oct. 30, 2018

(54) COUPLING TRANSFER SYSTEM

(71) Applicant: NATIONAL INSTITUTE OF ADVANCED INDUSTRIAL SCIENCE AND TECHNOLOGY (AIST), Chiyod-ku, Tokyo (JP)

(72) Inventors: Shiro Hara, Tsukuba (JP); Hitoshi Maekawa, Tsukuba (JP)

(73) Assignee: NATIONAL INSTITUTE OF ADVANCED INDUSTRIAL SCIENCE AND TECHNOLOGY (AIST), Tokyo (JP)

( * ) Notice: Subject to any disclaimer, the term of this patent is extended or adjusted under 35 U.S.C. 154(b) by 0 days.

(21) Appl. No.: 14/625,508

(22) Filed: Feb. 18, 2015

(65) Prior Publication Data

US 2015/0170948 A1    Jun. 18, 2015

Related U.S. Application Data

(63) Continuation of application No. 13/702,518, filed as application No. PCT/JP2011/062332 on May 30, 2011, now Pat. No. 9,016,501.

(30) Foreign Application Priority Data

Jun. 8, 2010    (JP) .................................. 2010-131471

(51) Int. Cl.
*H01L 21/677* (2006.01)
*B65D 51/28* (2006.01)
(Continued)

(52) U.S. Cl.
CPC .... *H01L 21/67742* (2013.01); *A47B 47/0091* (2013.01); *A47B 81/00* (2013.01);
(Continued)

(58) Field of Classification Search
CPC ......... H01L 21/67772; H01L 21/67742; H01L 21/67745; B65D 2313/04
(Continued)

(56) References Cited

U.S. PATENT DOCUMENTS

| 4,532,970 A | 8/1985 | Tullis et al. |
| 4,674,939 A | 6/1987 | Maney et al. |

(Continued)

FOREIGN PATENT DOCUMENTS

| JP | 05-082623 A | 4/1993 |
| JP | 05-109863 A | 4/1993 |

(Continued)

OTHER PUBLICATIONS

The extended European search report dated by European Patent Office on Mar. 4, 2015 in the corresponding European patent application No. 11792313.6—6 pages.

(Continued)

*Primary Examiner* — Jeffrey Allen
*Assistant Examiner* — Jennifer Castriotta
(74) *Attorney, Agent, or Firm* — Knobbe, Martens, Olson & Bear, LLP

(57) ABSTRACT

A transfer box has a sealing structure hermetically sealable by means of tight coupling of a transfer box body and a transfer box door. The transfer box is structured in such a way that magnets on the transfer box body face magnetic bodies on the transfer box door when the transfer box door is closed on the transfer box body, with these magnets and magnetic bodies forming a magnetic closed circuit.

5 Claims, 5 Drawing Sheets

(51) Int. Cl.
  *A47B 47/00* (2006.01)
  *A47B 81/00* (2006.01)
  *H01L 21/673* (2006.01)

(52) U.S. Cl.
  CPC .......... *B65D 51/28* (2013.01); *H01L 21/6773* (2013.01); *H01L 21/67379* (2013.01); *H01L 21/67745* (2013.01); *H01L 21/67751* (2013.01); *H01L 21/67772* (2013.01); *H01L 21/67775* (2013.01); *B65D 2313/04* (2013.01)

(58) Field of Classification Search
  USPC ........................................................ 220/230
  See application file for complete search history.

(56) References Cited

U.S. PATENT DOCUMENTS

| | | | |
|---|---|---|---|
| 4,724,874 A | 2/1988 | Parikh et al. | |
| 4,995,430 A | 2/1991 | Bonora et al. | |
| 5,169,272 A | 12/1992 | Bonora et al. | |
| 5,343,181 A | 8/1994 | Negus | |
| 5,451,131 A * | 9/1995 | Hecht | H01L 21/67126 118/50 |
| 5,562,383 A * | 10/1996 | Iwai | H01L 21/67769 118/719 |
| 5,772,386 A | 6/1998 | Mages et al. | |
| 6,152,669 A | 11/2000 | Morita et al. | |
| 7,607,430 B2 | 10/2009 | Davis | |
| 2003/0224295 A1 | 12/2003 | Heerens et al. | |
| 2007/0201967 A1 | 8/2007 | Bufano et al. | |
| 2010/0282638 A1 * | 11/2010 | Chiu | H01L 21/67369 206/710 |

FOREIGN PATENT DOCUMENTS

| | | |
|---|---|---|
| JP | 05-109864 A | 4/1993 |
| JP | 06-037175 A | 2/1994 |
| JP | 06-084738 A | 3/1994 |
| JP | 07-235580 A | 9/1995 |
| JP | 08-172120 A | 7/1996 |
| JP | 2000-216175 A | 8/2000 |
| JP | 2004-039986 A | 2/2004 |
| JP | 2004-140278 A | 5/2004 |
| WO | WO 1999/052140 A1 | 10/1999 |
| WO | WO 2011/155355 A1 | 12/2011 |

OTHER PUBLICATIONS

International Search Report dated by Japan Patent Office on Sep. 6, 2011 in the corresponding PCT patent application No. PCT/JP2011/062332.

* cited by examiner

[Fig. 1]
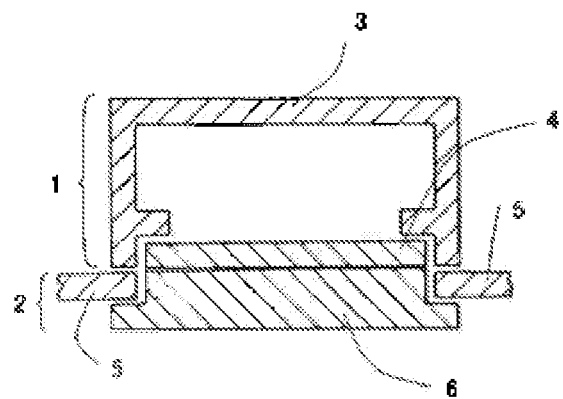
(a)
Background Art
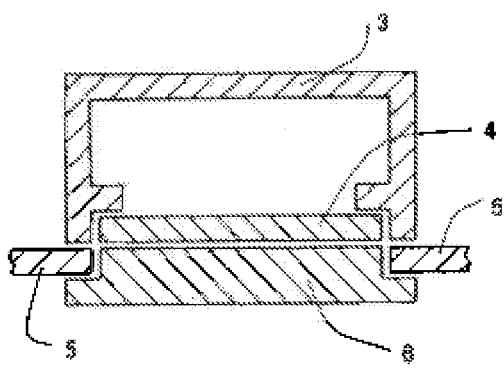
(b)
Background Art
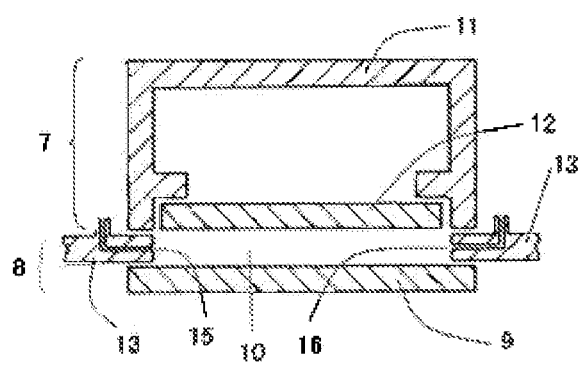
(c)

[Fig. 2]
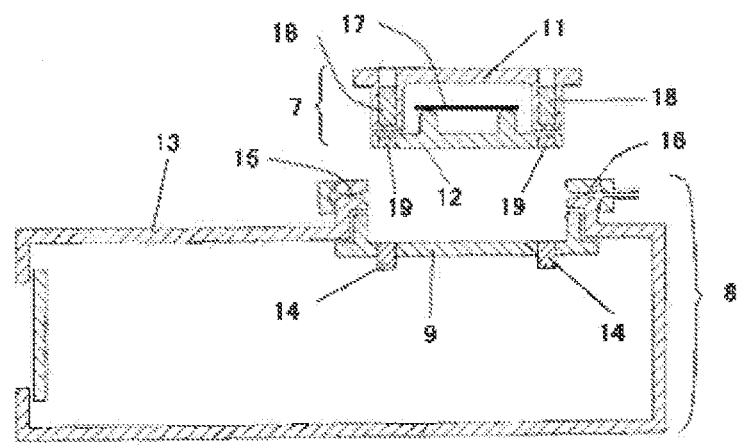
[Fig. 3]
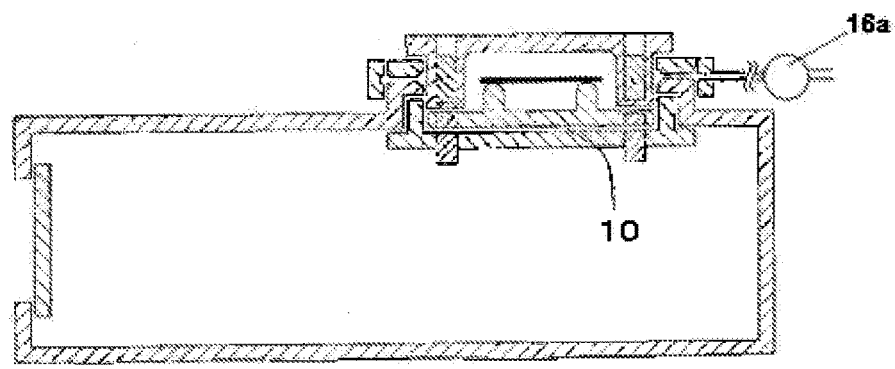
[Fig. 4]
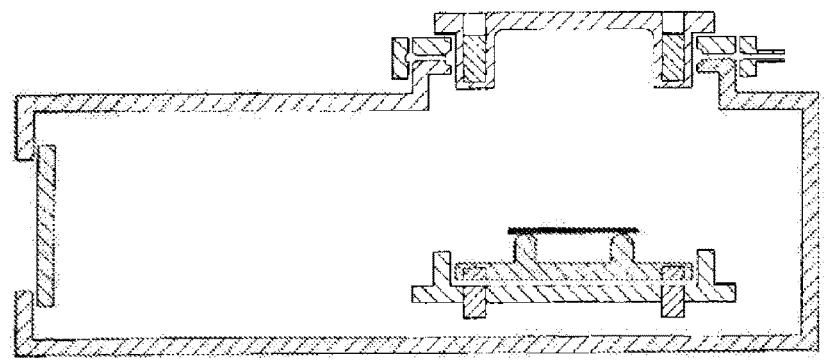

[Fig. 5]
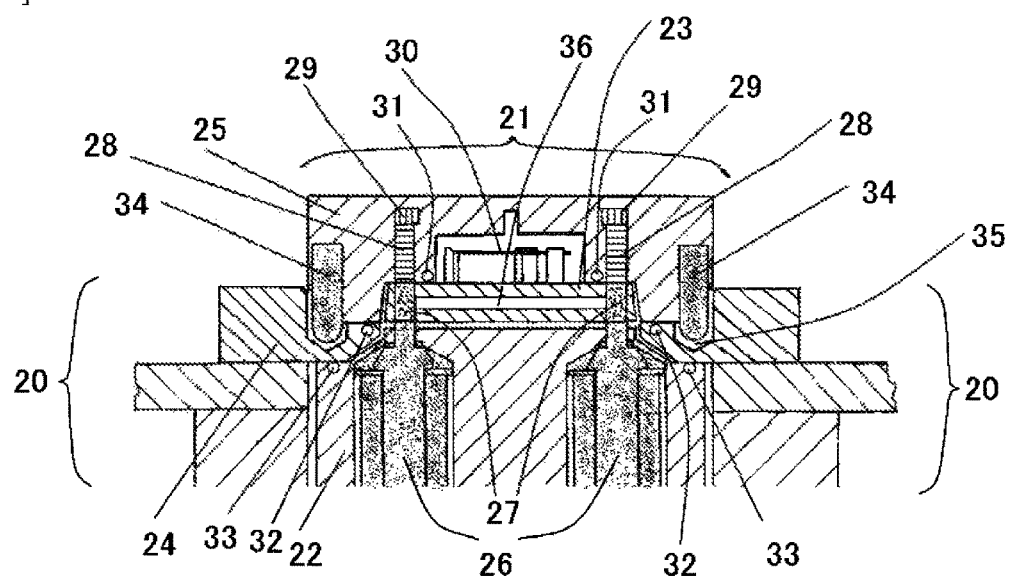
[Fig. 6]
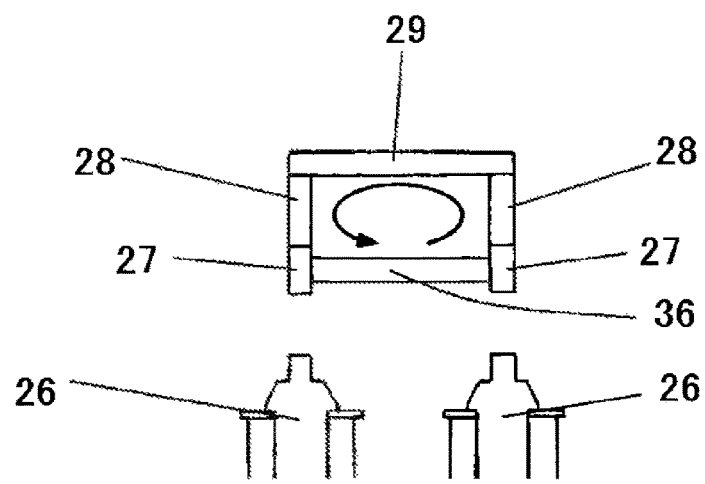

[Fig. 7]
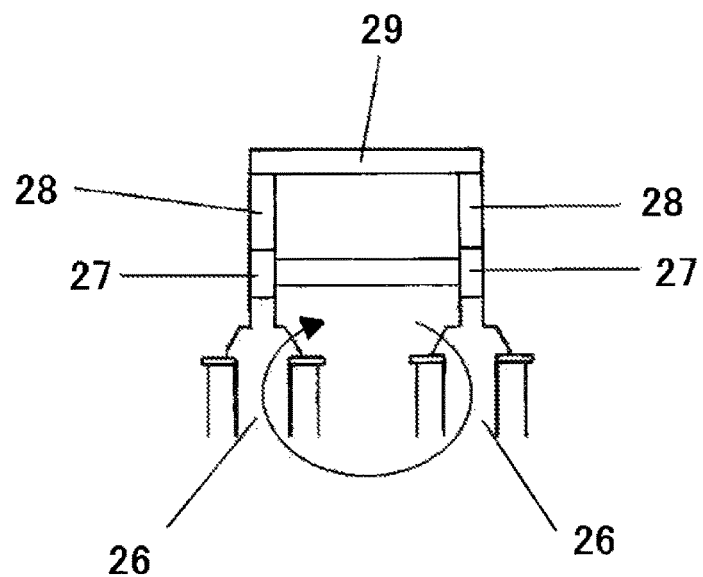
[Fig. 8]
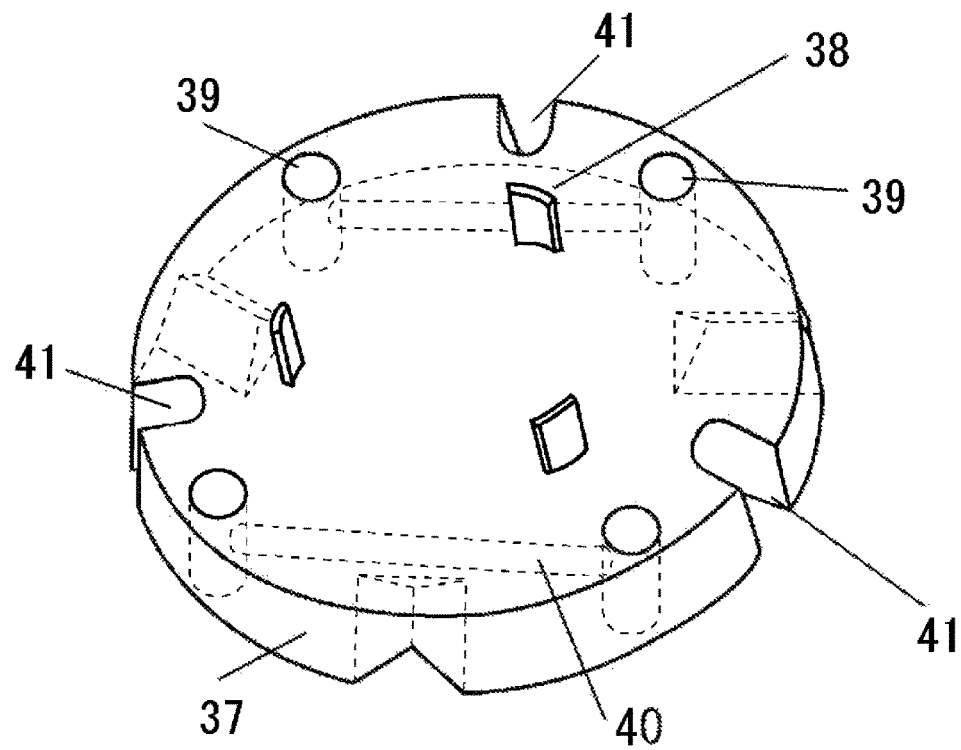

[Fig. 9]
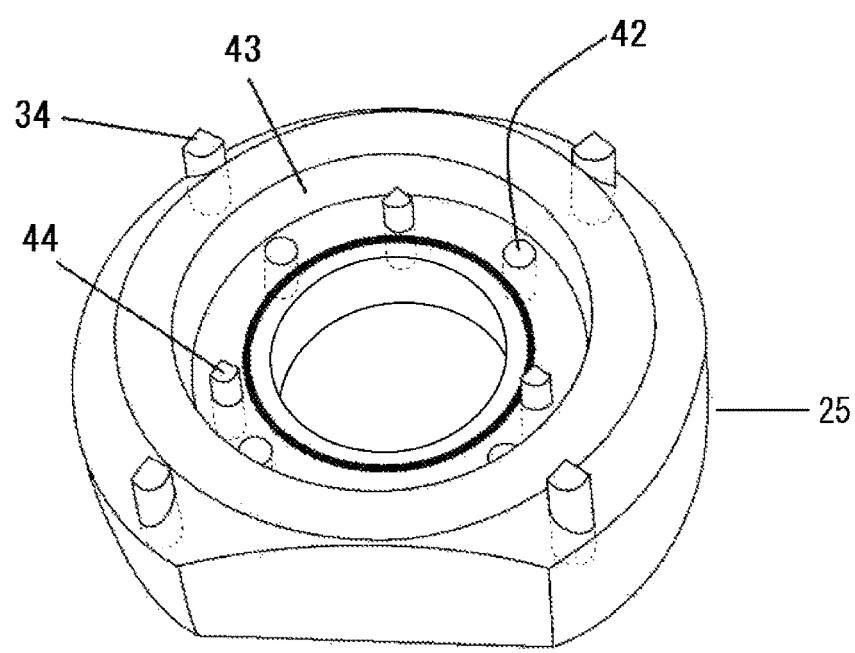

COUPLING TRANSFER SYSTEM

CROSS-REFERENCE TO RELATED APPLICATIONS

This application is a continuation of U.S. patent application Ser. No. 13/702,518, filed Feb. 27, 2013, which is the U.S. National Phase under 35 U.S.C. § 371 of International Application PCT/JP2011/062332, filed May 30, 2011, which claims priority to Japanese Patent Application No. 2010-131471, filed Jun. 8, 2010, each disclosure of which is incorporated by reference in its entirety. The International Application was published under PCT Article 21(2) in the language other than English. The applicant herein explicitly rescinds and retracts any prior disclaimers or disavowals made in any parent, child or related prosecution history with regard to any subject matter supported by the present application.

TECHNICAL FIELD

The present invention relates to a method of manufacturing elements, precision devices, and other manufactured products representative of which are semiconductor devices and thin-film display devices requiring cleanness, as well as a manufacturing apparatus and cleaning technology.

BACKGROUND ART

The semiconductor industry and various other industries characterized by giant factories are facing an increasingly serious problem of ballooning equipment investments and operating costs due to their factory size, which are often greater than the production output and thereby make the business unprofitable.

A majority of the aforementioned manufacturing factories have manufacturing processes using clean rooms, except for chemical plants where clean rooms are not the best option for cleaning because their plants are even larger than those in other industries. Accordingly, the idea of reducing equipment investment by downgrading the clean rooms through various methods such as locally clean production methods is beginning to be recognized as an immediately effective solution to the aforementioned problem. In some industries these methods are already put into practical use and their use is spreading. Local cleanness also has the effect of reducing the environmental control cost of the factory.

The only example of applying a locally clean production method to all the processes of a factory is one described in Non-patent Literature 1 involving pre-processes for manufacturing semiconductor integrated circuits. The manufacturing system described therein transfers the wafer being manufactured, between independent manufacturing apparatuses in a box. Each of these apparatuses has a port. The port has two doors. One door connects the apparatus and the port, while the other door connects the port and the outside world. By operating the apparatus in such a way that one of the doors is always closed, the interior of the apparatus can always be isolated from the outside world. The wafer box is coupled to the port. When the wafer box is coupled to the port, the wafer ambience can be isolated from the outside world to some extent, thereby allowing the wafers to be exchanged between the box and the manufacturing apparatus.

The box must be light, small, and simple in its mechanism in order to make sure it can be easily transferred. To achieve this requirement, ingenious ideas are needed as to how the box should be opened and closed and especially how the box door should be stored when opened. To be specific, the mode of storing the box door in the wafer box when the port is coupled is against the aforementioned requirement because extra space is needed to store the door. Accordingly, an appropriate coupling structure is such that the wafer box door is stored inside the port. HIP has obtained a patent (Patent Literature 1) pertaining to a coupling method that considers this point.

This patent is mainly characterized in that it has three subsystems including (1) a port, (2) a wafer transfer box, and (3) a wafer transfer mechanism inside the port, and that "the two doors are linked and moved into the clean interior space." The name of this system, "Standard Mechanical InterFace, or SMIF" has subsequently become the standard name for this system. The reason why the two doors are linked is as follows. Fine particles are attached to the exterior surfaces of the two doors that are contacting the outside world containing fine particles. By linking the doors, these fine particles can be trapped between the doors and as the doors are stored inside the port, spreading of fine particles into the locally clean environment can be prevented.

As shown in FIG. 1 (*a*), a box 1 comprises a box body 3 and a box door 4, while a port 2 comprises a port body 5 and a port door 6, and seals are provided in three locations including (a) between the box body 3 and box door 4, (b) between the port body 5 and port door 6, and (c) between the box body 3 and port body 5, where the three subsystems are needed as an axiom to perform transfer operations through separation of the interior and exterior, and therefore one key point of patentability of the SMIF patent lies in the sandwiching and trapping of fine particles attached to the surfaces of these two doors. However, sandwiched fine particles are not eliminated from this area. Also, no countermeasure is taken to control the risk of wafer contamination caused by fine particles dropping from the end faces of doors sandwiching them. In addition, structurally the port and wafer transfer box are not coupled in a hermetical manner, meaning that the structure presented by this patent does not function to completely prevent intrusion of external wafer contaminants into the port and wafer transfer box.

Asyst subsequently commercialized this SMIF system as a 200-mm wafer system. In relation to this practical system, Asyst patented an improvement mechanism for adding hermetical sealing to the SMIF system (Patent Literature 2). According to this patent, the coupling part comprises four structures, or namely a box, a box door, a port, and a port door. Also, this patent is characterized in that, as shown in FIG. 1 (*b*), hermetical seals are provided between the contacting pairs of these four structures such as (a) between the box body 3 and box door 4, (b) between the port body 5 and port door 6, (c) between the box body 3 and port body 5, and (d) between the box door 4 and port door 6.

Thereafter, several patents of improvements to the aforementioned patent were registered in light of incompleteness of this sealing method. The specific patents cover a mechanism to replace or purge gas in the box (Patent Literature 3), a method to suppress generation of fine particles from the mechanical structure for latching the door (Patent Literature 4), and a method to suppress fine particles generated from the complex mechanical structure provided inside the box door, by using the effect of non-contact seal obtained by generating, in each movement stage for opening/closing the box door and apparatus door, a gas flow that causes fine particles to flow out of the apparatus and box (Patent Literature 5). However, this series of improvement patents created negative effects, as explained below, that made the mechanism more complex. The specific negative effects are increased manufacturing cost, increased weight, generation of new fine particle generation sources, and difficulty cleaning the box, among others. These improvement patents not only failed to isolate gas to a practically acceptable level, but they also failed to achieve complete isolation of fine particles. In addition, the fact that further improvements were necessary to suppress and eliminate generation of fine particles through the improvement patents, means that the SMIF system and the first four sealing methods implemented by Asyst cannot completely isolate fine particles and that they are not the best hermetical coupling system.

Thereafter in 2000 or thereabout, when the size of the latest wafers reached 300 mm, another SMIF system adopting sealing methods different from those of Asyst was proposed and became the global standard for 300-mm wafer transfer systems. This standard system is normally called the "Front-opening Interface Mechanical Standard, or FIMS." This system, despite being a part of global SEMI standards (primarily SEMI Std. E57, E47.1, E62 and E63), is patented (Patent Literature 6). The FIMS adopts horizontal coupling to an opening provided in the horizontal direction from the box door.

This is in contrast to the vertical coupling method adopted by Asyst's system. Also, Asyst's vertical coupling system stores wafers in a cassette inside the box. Once coupled, the two linked doors are stored inside and then the entire cassette moves into the port. On the other hand, the FIMS has no cassette and the two doors linked in the horizontal direction move into the port and then drop vertically, after which the wafers in the box are directly taken out into the port using the wafer transfer robot provided in the port.

Furthermore, the FIMS patent is different from Asyst's patent in that it does not specifically define the sealing structure in the contact areas between structures. In an actual FIMS system put to practical use, a clearance of around 1 to 2 mm is intentionally provided between the structures. To be specific, such clearance is provided between the box and the port, and between the port and the port door. One reason for doing this is that any sealing structure based on physical contact generates mechanical rubbing in the seal area, which then causes a large amount of fine particles to generate. By providing no seals, the patent also differs from what is claimed in Asyst's patent. However, these clearances present a drawback in that theoretically, gas molecules cannot be sealed.

Asyst's 200-mm wafer system also has a pressure relief hole in the box that connects to the outside world for two purposes, one of which is to lessen the problem of fine particle generation caused by pressure change and consequent gas flow generating in the local environment as the box door and port door are opened and closed after coupling, and the other of which is to prevent the box door from becoming too tight due to negative pressure that might generate if the box is hermetical. This, in reality, structurally prevents isolation of, in particular, gas molecules. A pressure relief hole is also provided for the same reason in the box of the 300-mm wafer FIMS system, or Front Opening Unified Pod (FOUP). As described, conventional SMIF systems are not fully hermetical.

What is understood from the aforementioned conventional patents and known practical examples is that, while a locally clean production system with interior/exterior separation capability also effective on gas and other small molecules can be built with a hermetical mechanism having seals in respective areas, such system can produce a side effect of generating a large amount of fine particles due to mechanical rubbing, etc., of these seals. If a structure with clearances is used, on the other hand, generation of fine particles can be suppressed, but the interior and exterior cannot be separated in terms of gas molecules. This is a defect caused by a self-contradiction of the SMIF system. As a result, practical systems had no choice but to adopt an incompletely hermetical structure.

In fact, FIMS systems meeting the global standard that have been introduced to all semiconductor integrated circuit manufacturing factories supporting the latest 300-mm wafers have clearances and therefore cannot completely isolate not only gas molecules but also fine particles. One negative consequence of this is that, although a locally clean production system with complete isolation capability should eliminate the need for clean rooms, in reality all factories still operate their SMIF systems inside clean rooms. In other words, redundant cleanness is needed at the present, including clean rooms and local cleanness. This adds to equipment investment and requires high levels of management, which in turn pushes up the manufacturing cost to a significant extent.

Lastly, another important aspect, in addition to the aforementioned difficulty eliminating gas molecules and fine particles at the same time, is a need for a space called "port" to separate the apparatus space and human space. This necessitates a total of three doors, including two port doors and one transfer box door, which is essentially a cause of complexity of the coupling system.

Also, Patent Literatures 7 to 9 describe apparatuses, each of which has a pod contacting an apparatus in a manner allowing the pod door and apparatus port door to face each other, where these pod door and port door are moved to open the pod. However, the space formed by the pod door and apparatus port door is simply replaced by nitrogen and the surfaces of members defining the space are not cleaned, and if the interior of the pod or apparatus is vacuum, nitrogen replacement does not work due to pressure difference.

Patent Literature 10 describes a magnetic means and means using vacuum force for retaining the cap on the storage box, but these means only retain the cap and do not clean the cap surface or the surface of the apparatus door facing the cap.

The invention described in Patent Literature 11 joins the shutter-cum-lid of the vacuum clean box and the shutter of the clean apparatus in an airtight manner, after which the hermetical space is evacuated and then the shutter lid and shutter are opened separately. However, such method must be entirely implemented in vacuum and the exterior surfaces of all members must be cleaned beforehand.

The invention described in Patent Literature 12 evacuates the space formed by the lid of the exposure mask box and the lid of the apparatus and then opens these lids. However, this method can be used only for vacuum apparatuses and it simply creates vacuum and does not perform cleaning.

PATENT LITERATURES

Patent Literature 1: U.S. Pat. No. 4,532,970
Patent Literature 2: U.S. Pat. No. 4,674,939
Patent Literature 3: U.S. Pat. No. 4,724,874
Patent Literature 4: U.S. Pat. No. 4,995,430
Patent Literature 5: U.S. Pat. No. 5,169,272
Patent Literature 6: U.S. Pat. No. 5,772,386
Patent Literature 7: Japanese Patent Laid-open No. Hei 05-082623

Patent Literature 8: Japanese Patent Laid-open No. Hei 06-084738

Patent Literature 9: Japanese Patent Laid-open No. Hei 05-109863

Patent Literature 10: Japanese Patent Laid-open No. Hei 06-037175

Patent Literature 11: Japanese Patent Laid-open No. Hei 07-235580

Patent Literature 12: Japanese Patent Laid-open No. 2004-039986

NON-PATENT LITERATURES

Non-patent Literature 1: "Kyokusho Kurinka-no Sekai (World of Local Cleaner)" (Shiro Hara, Kogyo Chosakai Publishing, ISBN 4-7693-1260-1 (2006))

SUMMARY OF THE INVENTION

Problems to be Solved by the Invention

If there are two doors, essentially the apparatus space and human work space should be separable by not opening both doors at the same time. Under the prior art, however, there are three doors including two port doors and one transfer box door, and because each of these doors must have a mechanism for opening/closing, etc., the apparatus becomes complex. The present invention solves this problem by reliably sealing outside air and allowing the content to be transferred and loaded into the apparatus with a simpler structure.

With a hermetic mechanism sealing each part, it is possible to build a locally clean production system with interior/exterior separation capability also effective on gas and other small molecules, but such system, on the other hand, produces a side effect of generating a large amount of fine particles due to mechanical rubbing, etc., of seals. If a structure with clearances is used, on the other hand, generation of fine particles can be suppressed, but the interior and exterior cannot be separated in terms of gas molecules. In other words, the prior art did not provide any method for transferring manufactured products in a manner eliminating fine particles while having a physical space isolation structure to completely eliminate gas molecules. Furthermore, the reality is that conventional transfer boxes have filters, etc., through which gas molecules in outside air can flow in and thus are not completely isolated.

The present invention uses a physical space isolation structure to solve the fine-particle-non-elimination problem of the conventional gas molecule isolation structure.

Means for Solving the Problems

To solve the aforementioned problems, the present invention provides a coupling system comprising: a transfer box having a transfer box body with magnetic bodies and a transfer box door, structured in such a way that the transfer box door and transfer box body are closed by means of the magnetic forces of the magnetic bodies; and an apparatus having an apparatus body and an apparatus door with magnets or magnetic bodies; wherein the coupling system is structured in such a way that: the transfer box has a first sealing structure hermetically sealable by means of tight coupling of the transfer box body and transfer box door; the apparatus has a second sealing structure hermetically sealable by means of tight coupling of the apparatus body and apparatus door; the transfer box and apparatus have a third sealing structure hermetically sealable by means of tight coupling of both; and only when the transfer box and apparatus are tightly coupled, one undivided coupling chamber is formed hermetically by the third sealing structure, and the transfer box door is separated from the transfer box and taken into the apparatus.

In addition, the coupling chamber can have a clean gas intake hole and exhaust hole and can be structured in such a way that a valve that controls the pressure in the coupling chamber is directly connected to one of these holes or the coupling chamber, so that when the transfer box and apparatus are linked, the pressure in the coupling chamber can be made negative to the outside and the ambience in the coupling chamber can be replaced with any gas through the exhaust hole coupled with an exhaust apparatus or vacuum generator, or through the intake hole coupled with a gas feeder.

A structure whereby the apparatus door has electromagnets or magnets (permanent magnets or other objects charged with magnetism at room temperature) so that the transfer box door opens when the transfer box door is attracted to the apparatus door by means of the magnetic forces of the electromagnets or magnets; a structure whereby the transfer box body has magnetic bodies (objects to be magnetized), while the transfer box door has at least one set of two or more separated magnetic bodies connecting to one magnet, so that the transfer box body and transfer box door are closed when the magnetic bodies constituting each set are magnetized by the magnet and thereby attracted to the magnetic bodies on the transfer box body by means of magnetic attraction forces; and a structure whereby the transfer box door is attracted toward the apparatus door by means of the magnetic forces of electromagnets or magnets on the apparatus door so as to weaken the magnetic forces acting between magnetic bodies on the transfer box body and transfer box door and thereby open the transfer box door, can also be adopted.

It is also possible to adopt a transfer box that has V-shaped grooves extending in three different directions on the exterior surface of the transfer box door, positioning pins on the transfer box body around the transfer box door, and a slanted surface around the transfer box door; as well as an apparatus door and apparatus body having structures to engage with these V-shaped grooves, positioning pins and slanted surface, respectively.

In addition, the transfer box may be structured in such a way that the magnets on the transfer box body face the magnetic bodies on the transfer box door when the transfer box door is closed on the transfer box body; or the transfer box may be structured in such a way that the transfer box body has two or more magnetic bodies, while the transfer box door has at least one set of two magnetic bodies connecting to both ends of one magnet, so that the magnetic bodies constituting each set and magnetized by the magnet face the two or more magnetic bodies on the transfer box body when the transfer box door is closed on the transfer box body, and the transfer box body and transfer box door are closed by means of magnetic forces by the magnets on the transfer box door; or the two magnetic bodies connecting to both ends of the magnet may come close enough to the two or more magnetic bodies on the transfer box body, respectively, when the transfer box door is closed on the transfer box body, in order to exert the magnetic forces needed to keep the transfer box door closed on the transfer box body, while the two or more magnetic bodies on the transfer box body are connected inside the transfer box body so that the magnet and each magnetic body on the transfer box body and transfer box door form a magnetic closed circuit.

Effects of the Invention

According to the present invention, the fixed port of the apparatus, which is required in the conventional coupling system, is no longer necessary and the system structure can be thus simplified, and a space corresponding to the port and defined by means of tight contact between the transfer box and apparatus can be formed by a simple mechanism requiring sealing of only three locations, and by opening/closing of the transfer box body and box door and detachment/attachment of the box door and apparatus door by means of magnetism.

In addition, since the interior of the box, the space formed by three seals, and the interior of the apparatus have an equivalent pressure, it is no longer necessary to adjust the interior of the box to the pressure of outside air, and intrusion of dust, dirt, particles, etc., can be prevented upon opening/closing.

Furthermore, since the box door and apparatus door are detached/attached by means of magnetic force, there are no sliding parts upon detachment/attachment and fine particles do not generate. When a magnetic closed circuit is formed, magnetism does not leak to the outside.

BRIEF DESCRIPTION OF THE DRAWINGS

FIG. 1 Schematic drawings (a), (b) showing a connection of conventional transfer box and apparatus port; Schematic drawing (c) of a coupling system of transfer box and apparatus conforming to the present invention FIG. 2 Step to form a coupling system of transfer box and apparatus conforming to the present invention FIG. 3 Step to form a coupling system of transfer box and apparatus conforming to the present invention FIG. 4 Step to form a coupling system of transfer box and apparatus conforming to the present invention FIG. 5 Apparatus for opening/closing a transfer box door by forming a closed circuit using magnetic force FIG. 6 Schematic drawing showing a condition where the closed circuit using magnetic force is formed on the transfer box side in the apparatus illustrated in FIG. 5

FIG. 7 Schematic drawing showing a condition where the closed circuit using magnetic force is formed across the transfer box door and apparatus in the apparatus illustrated in FIG. 5

FIG. 8 Schematic drawing showing the interior side of a transfer box door conforming to the present invention FIG. 9 Schematic drawing showing the inner side of a transfer box conforming to the present invention

DESCRIPTION OF THE SYMBOLS

1—Conventional transfer box
2—Conventional apparatus port
3—Conventional transfer box body
4—Conventional transfer box door
5—Conventional apparatus body
6—Conventional apparatus door
7—Transfer box conforming to the present invention
8—Apparatus conforming to the present invention
9—Apparatus door
10—Coupling chamber
11—Transfer box body
12—Box door
13—Apparatus body
14—Electromagnet
15—Gas supply port
16—Gas exhaust port
17—Wafer
18—Magnet
19—Magnetic body
20—Apparatus
21—Box
22—Apparatus door
23—Box door
24—Apparatus body
25—Transfer box body
26—Electromagnet
27—Magnetic body
28—Magnetic body
29—Magnetic body
30—Processing target
31—Seal member
32—Seal member
33—Seal member
34—Positioning pin
35—Groove
36—Magnet
37—Slanted surface
38—Tab
39—Magnetic body
40—Magnet
41—Cutout
42—Magnetic body
43—Slanted surface
44—Projection

MODE FOR CARRYING OUT THE INVENTION

Clearly when the contents, or transfer target, is taken in and out between the transfer box and apparatus, it is necessary to provide doors on both the transfer box and apparatus in order to isolate the interior of the transfer box and interior of the apparatus separately from the outside world.

Under the present invention, the transfer box and apparatus are coupled in an airtight manner so that only two doors are needed to move the contents between them. One of the doors is the box door, while the other door is the apparatus door. These two doors are shaped in such a way that they form a coupling chamber only when the transfer box and apparatus are coupled in an airtight manner. Essentially the interior surfaces of the coupling chamber are the exterior surfaces of the two doors, so these surfaces are subject to contamination when exposed to the exterior space. Accordingly, when a coupling chamber is formed and a mechanism for cleaning the interior of the coupling chamber is equipped, greater cleanness is ensured and the interior of the transfer box, interior of the apparatus and interior space constituted by the coupling chamber can be separated from the outside.

With respect to the structure of and cleaning method for the small coupling chamber formed between the apparatus and transfer box when coupled, the present invention is different from the conventional SMIF system where only a very ambiguous method is defined, or from any method involving an apparatus with a fixed port.

The present invention does not require a fixed port, which means that there is no need to provide a door between the port and the processing chamber in the apparatus, and this not only reduces the number of necessary doors by one, but it also resolves the problem of incomplete interior/exterior isolation capability of the conventional locally clean production system. Under the present invention, a coupling chamber which is hermetically isolated from the outside is formed when the apparatus and transfer box are coupled. To do this, the following three sealing structures are provided.

First, the transfer box has a first sealing structure (seal 1) hermetically sealable by means of tight coupling of the transfer box body and transfer box door. For the mechanism of tight coupling, a latch or any other known means can be adopted.

Next, the apparatus has a second sealing structure (seal 2) hermetically sealable by means of tight coupling of the apparatus body and apparatus door. Finally, the transfer box body and apparatus body have a third sealing structure (seal 3) hermetically sealable by means of tight coupling of both. When the transfer box and apparatus are coupled, the third seal is established in addition to the first two seals, and these three seals form a single, undivided hermetical coupling chamber.

Here, for these sealing structures an O-ring, gasket or any other known sealing means can be adopted.

Because the coupling chamber formed by coupling constitutes a hermetical chamber, the environment of this coupling chamber such as pressure, fine particle concentration, and gas concentration can be controlled. To control this environment, the coupling chamber is equipped with input and output ports for inputting/outputting gas or controlling its pressure. With this structure, it is not necessary to link the box door and port door to trap and store fine particles. This structure, which can completely isolate the outside world and the space of manufactured product against both fine particles and gas molecules, is called the "Particle-Lock Airtight Docking or PLAD" structure.

The interior walls of the coupling chamber formed when the apparatus and transfer box are linked are configured by parts of the transfer box body, transfer box door, apparatus body, and apparatus door. When the apparatus and transfer box are not linked, the surfaces corresponding to the interior walls are contacting the exterior space and thus contaminated by contaminants and gas molecules in the exterior space attached to them. These surfaces exposed to the exterior space remain contaminated even when they form the interior walls of the coupling chamber upon linkage. As for these contaminants attached to the interior walls of the coupling chamber, cleaning gas can be blown from the cleaning gas introduction port provided on the coupling chamber to dissociate fine particles from the walls to which they are attached and discharge them from the exhaust port, by means of the wind force of the gas. Also, cleaning gas can be introduced to replace gas molecules chemically adsorbed to the surfaces using the cleaning gas, thereby causing the molecules to dissociate from the surfaces.

What is important is that adhered substances that cannot be eliminated by introducing cleaning gas and molecules remaining on the surfaces due to strong binding force can be ignored because they will not dissociate from the surfaces even after the transfer box door and apparatus door are opened to link the transfer box and apparatus. In addition, fine particles and gas molecules generated by friction, etc., due to physical contact by the transfer box and apparatus when the two are linked, can be eliminated from the coupling chamber before the two doors are opened, by introducing cleaning gas. As described, any contamination in the coupling chamber caused by formation of the seal 3 can be eliminated by the aforementioned method.

Furthermore, the ambience in the coupling chamber can be controlled to the same ambience in the apparatus so that the constitution of the ambience in the apparatus will not change before and after the transfer box door and apparatus door are opened.

By cleaning the coupling chamber with cleaning gas and then opening the seal 1 and seal 2, or specifically by opening the transfer box door and apparatus door into the apparatus, the interior space of the transfer box is linked to the interior space of the apparatus to allow for transfer of an object between the two. When the seal 1 and seal 2 are physically separated, some fine particles and gas molecules may generate from these seal areas and locations where the two doors were contacting the transfer box and apparatus members. If these contaminants thus generated enter the transfer box or apparatus, the object being transferred may be contaminated. Accordingly, ingenious ideas are needed to cause these contaminants generating from the seal areas to move toward the coupling chamber. Contaminants can be moved into the coupling chamber by setting the gas pressure in the coupling chamber lower than both the gas pressures in the transfer box and apparatus. This is because any substance flows from areas of high gas pressure to low gas pressure. Contaminants sucked into the coupling chamber are discharged to the outside via the exhaust port. Such contaminants generating from the coupled areas can be eliminated only when the box is airtight and a coupling chamber is provided.

However, if the gas pressure in the coupling chamber is different to some extent from the gas pressure in the transfer box or apparatus, it may be difficult to open the transfer box door or apparatus door against this pressure difference.

As is evident from the aforementioned structures and operations, generally the coupling chamber thus formed temporarily can be evacuated. Accordingly, by evacuating the coupling chamber the doors can be opened in a condition where there is virtually no pressure difference between both sides of the doors, even when there is vacuum inside the apparatus or transfer box. In general, oftentimes a vacuum apparatus is always kept in a vacuum state to eliminate the time needed to return the vacuum apparatus from a vacuum state to atmosphere and also to prevent contamination caused by opening the apparatus to atmosphere. For this reason, normally a port is provided for the vacuum apparatus. This port is switched between atmosphere and vacuum. Because of this, this port is sometimes called the "Air-Lock Chamber." Under the present invention, the conventional fixed port is no longer necessary because the coupling chamber functions as this air-lock chamber by switching between atmosphere and vacuum. Normally the port has a relatively large volume as it has a door and transfer mechanism, and for this reason it takes some time to exhaust the port. Under the present invention, on the other hand, the coupling chamber only occupies a small space created when the box and apparatus are linked, and therefore not much time is needed to clean the coupling chamber at the time of coupling and an apparatus used to clean the coupling chamber can be kept small. It should be noted, however, that this does not preclude providing of a port under the present invention.

In situations where contamination of the manufactured product due to fine particles presents a problem, cleaning of the coupling chamber becomes necessary among other options. If contamination by fine particles does not present a problem but contamination by gas molecules does, on the other hand, the gas introduction port and gas exhaust port of the coupling chamber may be omitted, provided that the impact of contamination is relatively minor. Since the volume of the coupling chamber is extremely small compared to the conventional port, the absolute amount of contaminants in the coupling chamber is small and when these contaminants spread into the transfer box and manufacturing apparatus and are thus diluted, their concentration drops by four digits or more, for example. In applications where contamination of such low level does not present a problem, it is not necessary to install a port, etc., for evacuating and cleaning the coupling chamber or introducing cleaning gas.

Next, how to open/close the transfer box is explained.

The transfer box door is structured in such a way that it opens into the apparatus after the transfer box is linked to the apparatus. Under a method whereby the box door opens outward before the linkage, another door is necessary to prevent the interior of the box from being exposed to the outside, which is disadvantageous because more space is needed and the mechanism efficiency drops. Under a method whereby the transfer box door is stored inside the box, allowing the door to be pulled in toward the back of the box requires more interior volume to be used to move the transfer box door, which is not desirable as it increases the size of the transfer box. Accordingly, the transfer box door is stored inside the apparatus.

As for the internal storage structure of the transfer box door, a method may be used which is adopted by household doors that are opened and closed by hinges. However, this is not an appropriate method because the sliding parts of hinges generate a large amount of fine particles. Under the present invention, the transfer box door is separately stored inside the apparatus body. The seal 1, which hermetically seals the transfer box door and transfer box, is positioned between the transfer box door and transfer box body. When the transfer box door moves vertically into the apparatus body to be stored, the seal does not shift laterally and any rubbing of the door and body can be kept to a minimum.

The box door is opened and closed by means of hook mechanisms, etc., equipped on the apparatus door. Under the present invention, magnetic hook mechanisms are used to suppress generation of fine particles and gas molecules. General mechanical lock mechanisms having many sliding parts generate a large amount of fine particles due to sliding of these parts when opened and closed, and accordingly these locks should not be used when a high degree of cleanness is required. Opening/closing mechanisms that use magnetism do not involve such mechanical operations and thus generate no sliding, which makes these mechanisms suitable for high-level cleanness because they generate significantly less fine particles.

Under the present invention, magnetic bodies are provided on the transfer box body and transfer box door (at least magnetic bodies on one of them are magnets) to close the transfer box door and transfer box body by means of the attraction force between the magnetic bodies. It is also possible to assemble magnets into the apparatus door to cause the transfer box door to be attracted to the apparatus door by means of their magnetic force so that the transfer box door will open. In this case, direct contact of electromagnets, magnetic bodies, etc., may also have to be prevented in order to adjust the magnetic force exerted by them.

The magnetic opening/closing mechanisms of the present invention are superior to mechanical opening/closing mechanisms in terms of cleanness, but magnetic opening/closing mechanisms are insufficient in some aspects as actual opening/closing mechanisms for transfer boxes. One reason is that, because the magnetic force depends strongly on the distance between the magnetic bodies, the attraction force suddenly strengthens at a distance of 1 mm or less and suddenly weakens at a greater distance, which requires the product to have high structural accuracy. Particularly when the magnetic bodies are in contact with each other, on the micron scale the surfaces of magnetic bodies have irregularities and thus the intended magnetic attraction force is not achieved unless the structural accuracy is also of the micron order. Also when there are many boxes of the same type such as transfer boxes, each box has slightly different dimensions and thus the magnetic attraction force may be different from one box to another.

To avoid the above problems, in the present invention, a structure can be adopted that allows for the distance between magnetic bodies to be controlled. Since the attraction force changes significantly according to the micron-scale distance between the two magnetic bodies contacting each other, the purpose of such structure is to avoid using such close distance in practical operations. If the distance is designed to around several tens of microns, the difference in attraction force at an accuracy error of 10 μm becomes relatively small. To further compensate for this already small difference in attraction force, the magnetic force of the opening mechanism on the apparatus side is determined with reference to the magnetic force at which the attraction force is likely to become the weakest.

[Transfer Box]

Under the present invention, the transfer box is a hermetical box used to transfer an object subject to contamination, reaction, or other problem when directly exposed to outside air. This "object" can be one of many things including a semiconductor substrate, sensor substrate, microorganism, culture medium, gene, unstable chemical compound, easily oxidized metal, harmful substance, substance that should be protected against contamination by chemical compounds, fungi, etc., substance whose diffusion should be prevented, highly reactive substance, or those handled in a clean room, glove box, or other apparatus in various applications today. Among others, semiconductor wafers and semiconductor chips of various sizes from in-process wafers of half an inch to large diameters such as 450 mm, etc., are commonly transferred in these transfer boxes.

Materials and characteristics of the transfer box body and door can be selected according to the characteristics of the object being transferred, where examples of desirable materials include poly(meth)acrylate, polycarbonate, polyethylene terephthalate, quartz, glass, and other materials offering excellent moisture resistance and dimensional stability. To open/close the transfer box door by means of magnetic force as described above, magnetic bodies and magnets are placed at least in locations where the transfer box and door made of any of the above materials are to be hermetically sealed.

Needless to say, the size of the transfer box is determined in relation to the size of the object being transferred, and one transfer box can have multiple chambers to store multiple objects. For example, one transfer box can have a door on the front side and another on the back side, with independent chambers provided inside, or multiple doors can be provided side by side on the surface of a disk-shaped transfer box with a chamber provided that corresponds to each door, etc.

For greater utility, it is desirable to provide a mechanism for locking the door to prevent it from opening unexpectedly while the transfer box is being transferred or otherwise used as a standalone box, and also provide a mechanism for automatically releasing the lock once the transfer box is tightly coupled with the apparatus.

The transfer box must have a pressure member or other means to secure the stored object in the transfer box because if the stored object moves unexpectedly inside the transfer box, opening the transfer box door and introducing the object into the apparatus will become difficult or the possibility of the stored object being damaged will increase.

[Interface of Transfer Box and Apparatus]

As the transfer box surface on the door side connects to the apparatus door, the transfer box door must be positioned accurately, without any displacement, relative to the apparatus door. The same applies regardless of whether the transfer box is manually connected to the apparatus door or by means of a transfer apparatus.

Also, if the transfer box slides against the apparatus door at any part, particles may generate from this part and subsequently contaminate the interior of the apparatus or the object inside the transfer box. Accordingly, the door side of the transfer box must have a certain structure.

First, the transfer box door is installed in a manner embedded into the transfer box body. Then, the area around the transfer box body surface on the door side is slanted toward the side face of the transfer box. This slanted area corresponds to another slanted area provided around the port of the apparatus body toward the center of the port.

Furthermore, the transfer box body has multiple projections around the transfer box door, with these projections designed to engage with the recesses provided at the port of the apparatus body.

Furthermore, the exterior surface of the transfer box door has three projections with a semispherical tip, and three V-shaped radially extending grooves are provided on the apparatus door surface in a manner corresponding to these projections.

The transfer box body, transfer box door, apparatus body and apparatus door having the aforementioned structures are used to connect the transfer box accurately to the apparatus door in the manner described below.

First, the transfer box approaching the apparatus body starts to enter the apparatus body in such a way that the aforementioned slanted area provided around the transfer box body surface on the door side matches the slanted area provided around the port of the apparatus body. Once the transfer box has been inserted halfway, the transfer box is positioned, with some play, relative to the apparatus body.

Next, the aforementioned multiple projections provided on the transfer box body around the transfer box door engage with the corresponding recesses provided at the port of the apparatus body. At this time, the aforementioned play is significantly reduced and the rotation of the transfer box around the vertical axis is somewhat suppressed.

When the transfer box approaches the apparatus door further in this condition, the three projections with a semispherical tip provided on the transfer box door enter the aforementioned three V-shaped grooves provided on the apparatus door. When this happens, the two opposing slanted surfaces constituting one V-shaped groove each contact a semispherical projection, and the semispherical projection contacts these two opposing slanted faces at two locations.

As a result, the transfer box no longer wobbles around the vertical axis in the rotating direction, and the three radially extending V-shaped grooves eliminate any wobbling in the horizontal direction.

These mechanisms secure the transfer box by making it impossible for the transfer box to move other than in the vertical direction with respect to the apparatus body.

[Apparatus]

The apparatus tightly coupled with the aforementioned transfer box is any one of various apparatuses designed to handle the "object" being transferred as described above, where a semiconductor manufacturing apparatus may be selected if the object is a semiconductor substrate; a sensor manufacturing apparatus may be selected if the object is a sensor substrate; a culture apparatus or analyzer may be selected if the object is a microorganism, culture medium or gene; a reaction apparatus or analyzer may be selected if the object is an unstable chemical compound or easily oxidized metal; an analyzer or other proper handling apparatus may be selected if the object is a harmful substance; or any one of various other known apparatuses that must be operated by isolating outside air may be selected.

Among others, for a semiconductor manufacturing apparatus any one of a series of various apparatuses used in semiconductor manufacturing processes can be used.

Examples

Examples are explained below based on the drawings

FIG. 1 ($c$) is a drawing showing a transfer box 7 and an apparatus 8, which together constitute a coupling system conforming to the present invention, and are tightly coupled, where the transfer box 7 and apparatus 8 are contacting each other based on a known means (not illustrated) for securing the transfer box 7 to the apparatus 8 and thereby the two are tightly coupled. Here, the most characteristic point of the present invention is that the transfer box 7 does not contact the port of the apparatus 8, but it can be contacted with the apparatus 8 itself. However, this does not preclude the transfer box 7 contacting the apparatus port.

As mentioned above, as a result of tight coupling of the transfer box 7 and apparatus 8, a coupling chamber 10 defined by a transfer box door 12 of the transfer box 7 and an apparatus door 9 of the apparatus 8 is formed as something like the port of a conventional coupling system.

Under the prior art, the port functions to connect outside air and the interior of the apparatus, or specifically different environments of atmospheric pressure and reduced pressure, or of atmospheric pressure and specific ambience, in order to transfer the object stored in the transfer box into the apparatus. On the other hand, the aforementioned coupling chamber 10 under the present invention behaves like the aforementioned port in that the environment in the coupling chamber 10 is adjusted from the same environment as the outside world immediately after the tight coupling, to an ambience similar to that in the apparatus, via a gas supply port 15 and gas exhaust port 16 connected to the coupling chamber, as the box door 12 and apparatus door 9 move as one into the apparatus and the two doors open.

Semiconductors or the like subject to processing steps implemented under vacuum require supply and exhaust of cleaning gas as mentioned above. In this case, a coupling system conforming to the present invention is required for each apparatus used in each step if the manufacturing line comprising multiple steps uses a different apparatus in each step.

If the ambience in the apparatus is vacuum, gas can be exhausted by a vacuum pump, etc., out of the coupling chamber 10 via the gas exhaust port 16, and if necessary, inert gas can be introduced subsequently into the coupling chamber via the gas supply port 15, after which this inert gas can be exhausted via the gas exhaust port 16, and these operations are repeated any number of times, to bring the environment in the coupling chamber 10 containing fine particles, etc., equivalent to the environment in the apparatus.

Needless to say, the environment in the coupling chamber 10 can be brought closer to the environment in the apparatus, if necessary, depending on the desired cleanness and ambience in the apparatus.

As mentioned, under the present invention the transfer box can be tightly coupled to the apparatus 8 directly, not to the port, and the apparatus 8 can have the gas introduction port 15 and gas exhaust port 16 so that these gas ports can be connected to the coupling chamber 10 formed as a result of the tight coupling.

For these gas ports to circulate gas and thereby clean the interior of the coupling chamber 10, gas must circulate throughout the coupling chamber 10 and also in a manner allowing for removal of particles, etc., attached to the opening of the box 7 and opening of the apparatus 8 previously contacted by the box door 12 and apparatus door 9.

Details of the tight coupling of the transfer box 7 with the apparatus 8 using a coupling system conforming to the present invention are described below using an example of introducing a wafer in the transfer box into the apparatus. It should be noted that the present invention is not at all limited to this example and other objects, such as a microorganism culture or unstable chemical compound, can be introduced.

FIG. 2 shows the transfer box 7 comprising a transfer box body 11 and a box door 12, with the transfer box body 11 and box door sealed in an airtight manner by a known sealing means. Provided on the transfer box body 11, in a manner extending from the box door toward the interior of the transfer box body 11, is a member to support a wafer 17.

By considering what will happen once the box 7 and apparatus 8 are tightly coupled, the transfer box 7 can have magnets 18 on the walls of the transfer box body 11, as well as magnetic bodies 19 made of iron, etc., on the box door 12 at locations to be contacted by the walls of the transfer box body 11. Here, the walls of the transfer box body 11 and the locations of the box door 12 where the magnetic bodies 19 are provided are extended, and electromagnets 14 are placed on the apparatus door 9 at locations to be contacted by the locations of the box door 12 where the magnetic bodies 19 are provided.

In the condition of the transfer box 7 shown in FIG. 2, the transfer box body 11 is making strong contact with the box door 12 by means of magnetic force and the interior of the transfer box body 11 is securely isolated from outside air. In addition, the apparatus door 9 of the apparatus 8 is securely contacting the apparatus body 13 by any means and the apparatus body 13 is also securely isolated from outside air.

Following this condition in FIG. 2, the transfer box 7 is then placed on the apparatus 8 having its apparatus door 9 on top, in a manner allowing the box door 12 facing downward to overlap with the apparatus door 9, as shown in FIG. 3. Here, it is important to provide positioning pins on either the transfer box 7 or apparatus 8 and holes to engage with these positioning pins on the other side, or otherwise ensure the transfer box 7 and apparatus 8 overlap with each other accurately. The positioning mechanism is not specifically limited to pins, and any known positioning means can be adopted.

The apparatus body 13 and apparatus door 9 are also sealed in an airtight manner by a known sealing means.

After the transfer box 7 is placed at an accurate position on the apparatus 8, operations are performed to tightly couple the two. If not tightly coupled, the transfer box 7 and apparatus 8 are not sealed in an airtight manner and gaps are formed between the two, and if the doors are opened in this condition, outside air enters the transfer box 7 and apparatus 8 and their interiors are contaminated by outside air, fine particles, etc.

A latch mechanism or other known means can be used to tightly couple the two, and the strength of tight contact will be sufficient as long as effective sealing is realized by a gasket or other known sealing means between the transfer box body 11 and apparatus body 13.

Once the transfer box 7 tightly contacts the apparatus 8, an airtight sealing structure is formed between the transfer box body 11 and apparatus body 13 by any known sealing means provided on either one or both. Then, the gas supply port 15 and gas exhaust port 16 (provided with a valve 16*a*) provided in the apparatus beforehand are used to adjust the environment in the coupling chamber 10 defined by the sealing means and formed between the box door 12 and apparatus door 9, in order to adjust it to the environment in the apparatus.

One specific adjustment method that can be adopted is to initially exhaust air via the gas exhaust port 16 from the coupling chamber 10 whose environment is the same as outside air, and thereby decompress the coupling chamber, and then introduce dry nitrogen gas, for example, via the gas supply port 15 and then exhaust it via the gas exhaust port 16 to decompress the coupling chamber or to repeat this method.

According to this method, the coupling chamber 10 whose environment is initially the same as outside air and which contains fine particles and other contaminants in addition to oxygen and other reactive gases becomes free from fine particles, etc., that can be removed by flows of gas supplied and exhausted, and at the same time oxygen and other reactive gases are also exhausted. Thereafter, the environment is adjusted to be the same as that in the apparatus 8; in other words, if the apparatus 8 is decompressed, then the coupling chamber 10 is also decompressed, and if the apparatus 8 has an inert gas ambience, the coupling chamber 10 is also adjusted to an inert gas ambience. Needless to say, the environment of the coupling chamber 10 can be adjusted by other steps.

This adjustment of the coupling chamber 10 environment is not particularly different from the adjustment performed in the port of the conventional apparatus, but because the coupling chamber defined by the doors of both the transfer box 7 and apparatus 8, etc., is significantly smaller than the conventional port, an apparatus needed to supply and exhaust gas can be smaller and the time requirement is much shorter.

Next, how to move the wafer stored in the transfer box 7 into the apparatus 8 is explained.

Although not illustrated, an elevator or other apparatus to open/close the apparatus door 9 is provided in the apparatus 8, and the wafer secured to the box door of the transfer box 7 is transferred into the apparatus 8, together with the box door 12 and apparatus door 9, to be processed by the processing means inside the apparatus.

When the linked box door 12 and apparatus door 9 are both moved into the apparatus 8, the tight contact between the box door 12 and transfer box body 7 is released.

An example of this releasing means is described below.

The magnetic bodies 19 provided on the box door 12 are magnetically contacting the magnets 18 provided on the walls of the transfer box body 7 due to the magnetic forces received from the magnets 18.

Accordingly, separating the box door 12 from the transfer box body 11 requires application of enough force to the magnetic bodies 19 in the direction of separating the box door 12 to resist the magnetic forces received from the magnets 18 acting upon the magnetic bodies 19.

In FIG. 3, current is supplied to the electromagnets 14 provided on the apparatus door 9 to apply magnetic forces to the magnetic bodies 19 so that the magnetic forces applied to the magnetic bodies 19 due to the electromagnets 14 become stronger than the magnetic forces applied due to the magnets 18, thereby allowing a closed magnetic-force circuit to form and causing the box door 12 to magnetically contact the apparatus door 9.

By moving the apparatus door 9 downward with the box door 12 magnetically contacting the apparatus door 9, both the apparatus door 9 and box door 12 are introduced into the apparatus, as shown in FIG. 4. Current supply to the electromagnets can be stopped once the magnetic forces applied to the box door 12 from the magnets 18 weaken to some extent.

In this condition, the coupling chamber 10 comprising the apparatus door 9 and box door 12 is connected to the space inside the apparatus 8, but since the environment of the coupling chamber 10 is already the same as the environment in the apparatus 8, there is no contamination in the apparatus due to the coupling chamber 10.

It should be noted that, while the apparatus 8 in this example has the gas supply port 15 and gas exhaust port 16, these ports may not be necessary in a certain situation. It is when the interior volume of the coupling chamber 10 is significantly small compared to the interior volume of the apparatus 8, so even if fine particles and gases present in the coupling chamber 10 are mixed into the ambience in the apparatus 8, the level of contamination caused by such mixing is negligibly small.

Here, it is possible to, for example, provide an open/close pipeline on the apparatus door 9 in a manner connecting the interior of the apparatus 8 to the interior of the coupling chamber 10, so that even after the coupling chamber 10 is formed due to tight contact of the transfer box 7 and apparatus 8, the coupling chamber 10 can be connected to the interior of the apparatus 8 by opening the pipe line, in order to equalize the pressures and other environment conditions between the coupling chamber 10 thus formed and the apparatus 8.

In addition, the apparatus door of the apparatus 8 in the above example may be facing sideways or downward, with the box door 12 of the transfer box 7 facing sideways or upward.

Another mechanism of opening/closing the box door and apparatus door by means of magnetic force is explained based on FIG. 5.

FIG. 5 is a drawing showing a transfer box 21 tightly contacting an apparatus 20, with a box door 23 facing the top face of an apparatus door 22 and area around the box door 23 of a transfer box body 25 facing an apparatus body 24.

Electromagnets 26 are embedded in the apparatus door and their tips are exposed to the top face of the apparatus door.

Magnetic bodies 27 are embedded in a manner facing the positions of the tips of electromagnets 26 and penetrating from the front side to the opposite side of the box door 23. The multiple magnetic bodies 27 are embedded and they are connected to both sides of a magnet 36 by means of magnetic force. At least one set of these two magnetic bodies 27 and magnet 36 is embedded.

Also, magnetic bodies 28 embedded in the transfer box body 25 are exerting magnetic forces on locations where the magnetic bodies 27 are exposed on the interior side, or transfer box body side, of the box door 23, and the box door 23 is secured to the transfer box body 25 by means of the magnetic attraction forces generating between the magnetic bodies 27 embedded in the box door 23 and magnetic bodies 28 embedded in the transfer box body 25, and as a result the interior of the transfer box body 25 is hermetically sealed by the box door 23.

The multiple magnetic bodies 28 embedded in the transfer box body 25 are connected to magnetic bodies 29 at locations away from the parts facing the box door 23, and in this condition the transfer box body and box door form a closed circuit as they are connected by means of magnetic force.

A processing target 30 is stored inside the transfer box body 25 in a manner secured to the box door 23 while being movable with the box door 23 to/from inside the apparatus 20, where the transfer box 21 and apparatus 20 must contact each other tightly to form a coupling chamber and the coupling chamber must be airtight against outside air in order to prevent intrusion of outside air and fine particles into the apparatus body 24 and transfer box body 25 while allowing the processing target to move into the apparatus or box.

For this reason, in FIG. 5, an O-ring or other sealing member 31 is provided to seal the transfer box body 25 and box door 23 in an airtight manner, while an O-ring or other sealing member 33 is provided to seal the apparatus body 24 and apparatus door 22 in an airtight manner, and additionally an O-ring or other sealing member 32 is provided to seal the transfer box body 25 and apparatus body 24 in an airtight manner, and these sealing members can keep the interior of the box 21 and interior of the apparatus 20 isolated from outside air not only when the box 21 is connected to the apparatus 20, but also when the two are not connected.

Furthermore, for the box 21 to be connected accurately to the apparatus 20 and the processing target 30 in the transfer box body 21 to move back and forth in the apparatus body 24 to be processed accurately, multiple positioning pins 34 provided on the transfer box body 25 must accurately engage or otherwise join with multiple holes and grooves provided on the apparatus body 24. Needless to say, positioning pins can be provided on the apparatus and holes and grooves on the box, but when operability is considered, it is desirable to provide positioning pins on the box and form holes and grooves on the apparatus in a manner engaging with the positioning pins.

The positioning pins 34 can have a circular, conical or pyramid tip, as long as their tip is clearly defined. Also, the holes and grooves 35 can have their interior surfaces shaped to reflect the tip shape of the positioning pins so that they engage with the positioning pins 34, but V-shaped grooves or U-shaped grooves are particularly desirable. At this time, two points near the tip of the positioning pin 34 can contact two points near the bottom of the hole or groove 35. If the positioning pin 34 has a circular tip and the hole or groove is V-shaped, for example, the circular part at the tip of the positioning pin may be positioned at the center of the V-shaped groove 35. Such positioning means can connect the box 21 accurately and infallibly to the apparatus 20 at a predetermined position.

Although not shown in FIG. 5, a gas supply port and a gas exhaust port like those shown in FIG. 2 are provided on the apparatus 20, and also the transfer box body 25 and apparatus body 24 are sealed in an airtight manner by the sealing member 32, and therefore the coupling chamber formed between the apparatus door 22 and box door 23 can be filled with any gas or adjusted to any pressure so as to bring its ambience to the ambience in the apparatus 20 or box 21.

In FIG. 5, the shapes of the box, apparatus, their doors, electromagnets and magnetic bodies as well as pins, holes and grooves are not at all limited to those illustrated, and any shapes can be used as long as similar functions can be demonstrated. It is also possible to use magnets instead of the electromagnets 26.

As shown in FIGS. 2 to 4, the apparatus shown in FIG. 5 also allows the box door to move into the apparatus together with the apparatus door to permit the specified processing, etc., inside the apparatus.

FIG. 6 shows the relationships of only magnetic bodies and electromagnets when the transfer box is positioned away from the apparatus in the condition shown in FIG. 5.

In FIG. 6, the transfer box is positioned away from the electromagnets and the electromagnets do not exert magnetic forces. On the other hand, the transfer box has the two magnetic bodies 27 connected by means of the magnet 36 embedded in the box door. Then, the magnetic bodies 28 provided on the transfer box body are connected to the magnetic bodies 27, respectively. Furthermore, the magnetic bodies 28 are connected by the magnetic body 29. As a result of these connections, a circuit of magnetic force in the direction of the arrow is formed by the respective magnetic bodies as shown in FIG. 6.

Similarly, FIG. 7 shows the relationships of magnetic bodies and electromagnets when the electromagnets 26 generate magnetic forces after the transfer box has been connected to the apparatus but the box door is not yet open.

First, when current is supplied to the electromagnets 26 to generate electromagnetic forces, the lines of magnetic forces heading toward the magnetic bodies 28 through the magnetic bodies 27 before the generation of electromagnetic forces stop heading toward the magnetic bodies 28 but are redirected to the electromagnets instead. As a result, a magnetic circuit comprising the magnet 36—magnetic body 27—electromagnet 26—electromagnet 26—magnetic body 27 is formed. As a result, the magnetic bodies 27 and electromagnets 26 have strong attraction forces. Because of this, the magnetic circuit constituted by the transfer box body 25 and box door 23 is virtually cut off as the lines of magnetic forces between the magnetic bodies 27 and magnetic bodies 28 weaken significantly. In other words, the attraction forces between the magnetic bodies 27 and magnetic bodies 28 become extremely weak and the magnetic lock between the transfer box body 25 and box door 23 is released.

As explained above, when magnetic forces are generated at the electromagnets, the magnetic lock between the transfer box body and box door is released, while the electromagnets and box door are magnetically locked, and this allows the box door to be opened.

Since the box door and apparatus door can be opened and closed simultaneously due to the actions of electromagnets, as mentioned above, outside air and external fine particles can be prevented from flowing into the box and apparatus and also a closed circuit of magnetic force can be formed before and after the opening/closing of the box door to prevent leakage of magnetic force to the outside.

A schematic drawing illustrating the structure of the transfer box door as viewed from the interior is shown in FIG. 8. The transfer box door closes in a manner embedded into the opening of the transfer box and has a disk shape whose entire periphery comprises a slanted surface 37 not vertical to the top face and bottom face of the transfer box door, with three tabs 38 for retaining the transfer target provided inside the transfer box. For example, a disk-shaped transfer target is placed on or engages with, and is thereby retained, by these tabs 38. The groove 35 is provided on the exterior surface of the transfer box door.

This transfer box door has magnetic bodies 39 and magnets 40 embedded in it.

The step to close the transfer box body 25 by the transfer box door 23 is explained based on FIGS. 8 and 9.

After the transfer target has been retained on the tabs 38 on the transfer box door 23, the transfer target is put in the transfer box in such a way that the transfer box door 23 engages with the transfer box body 25 having positioning pins with respect to the apparatus. Here, the transfer box door shown in FIG. 8 is reversed and engaged so that the slanted surface 37 of the transfer box door 23 corresponds to a slanted surface 43 inside the transfer box body 25. At this time, cutouts 41 provided around the transfer box door 23 engage with projections 44 provided in the transfer box. At the same time, the slanted surface 37 provided around the transfer box door in a manner corresponding to the slanted surface 43 gradually approaches the slanted surface 43 forming the interior surface of the transfer box body to cause the transfer box door to engage with the transfer box body, while at the same time the slanted surfaces 37 and 43 contact each other.

Furthermore, the magnetic bodies 39 on the transfer box door 23 are positioned in a manner facing magnetic bodies 42 provided in the transfer box body 25. At this time, the lines of magnetic forces of the magnets 40 are oriented toward the magnetic bodies 42 via the magnetic bodies 39, so that the magnetic bodies 42 on the transfer box body 25 side are attracted, by means of magnetic force, to the magnetic bodies 39 on the transfer box door side, causing the transfer box door 23 to be secured to the transfer box body 25.

We claim:

1. A transfer box having a sealing structure hermetically sealable by means of tight coupling of a transfer box body and a transfer box door, said transfer box structured in such a way that magnets of the transfer box body face magnetic bodies of the transfer box door when the transfer box door is closed on the transfer box body, wherein these magnets and the magnetic bodies which are connected together form a loop constituting a first magnetic closed circuit in which magnetism is transmitted through the magnets and the magnetic bodies, said magnetic bodies of the transfer box door being configured to form a loop constituting a second magnetic closed circuit with magnetized electromagnets connected together with the magnetic bodies when the electromagnets face the magnetic bodies on a side opposite to the transfer box body side in which magnetism is transmitted through the magnetic bodies and the magnetized electromagnets.

2. A transfer box according to claim 1, wherein the first magnetic closed circuit is formed by enclosing an interior of the transfer box.

3. A transfer box having a sealing structure hermetically sealable by means of tight coupling of a transfer box body and a transfer box door, wherein the transfer box body has two or more magnetic bodies while the transfer box door has at least one set of two magnetic bodies connecting to both ends of one magnet, so that the magnetic bodies constituting each set and magnetized by the magnet face the two or more magnetic bodies of the transfer box body when the transfer box door is closed on the transfer box body, wherein these two or more magnetic bodies and the set of magnetic bodies which are connected together form a loop constituting a first magnetic closed circuit in which magnetism is transmitted through the magnets and the magnetic bodies, in order to open the transfer box body and transfer box door by means of magnetic force of the magnet on the transfer box door, said at least one set of two magnetic bodies of the transfer box door being configured to form a loop constituting a second magnetic closed circuit with magnetized electromagnets connected together with the magnetic bodies when the electromagnets face the at least one set of two magnetic bodies on a side opposite to the transfer box body side in which magnetism is transmitted through the magnetic bodies and the magnetized electromagnets.

4. A transfer box according to claim 3, wherein the two magnetic bodies connecting to both ends of the magnet on the transfer box door come close enough to the two or more magnetic bodies on the transfer box body, respectively, when the transfer box door is closed on the transfer box body, in order to exert the magnetic forces needed to keep the transfer box door closed on the transfer box body, wherein the two or more magnetic bodies on the transfer box body are connected inside the transfer box body so that the magnet and each magnetic body on the transfer box body and transfer box door form the first magnetic closed circuit.

5. A transfer box according to claim 3, wherein the first magnetic closed circuit is formed by enclosing an interior of the transfer box.

\* \* \* \* \*

UNITED STATES PATENT AND TRADEMARK OFFICE
CERTIFICATE OF CORRECTION

PATENT NO. : 10,115,619 B2  
APPLICATION NO. : 14/625508  
DATED : October 30, 2018  
INVENTOR(S) : Shiro Hara Page 1 of 1

It is certified that error appears in the above-identified patent and that said Letters Patent is hereby corrected as shown below:

On the Title Page

Item (71), Applicant, Line 4, change "Chiyod-ku, Tokyo (JP)" to --Chiyoda-ku, Tokyo (JP)--.

In the Specification

Column 2, Line 7, change "HIP" to --HP--.

Column 14, Line 16, change "drawings" to --drawings.--.

Signed and Sealed this
Tenth Day of September, 2019

Andrei Iancu
*Director of the United States Patent and Trademark Office*